United States Patent
Robinson et al.

(10) Patent No.: US 10,298,256 B1
(45) Date of Patent: May 21, 2019

(54) ANALOG TO DIGITAL CONVERSION USING DIFFERENTIAL DITHER

(71) Applicant: Raytheon Company, Waltham, MA (US)

(72) Inventors: Ian S. Robinson, Waltham, MA (US); James Toplicar, Waltham, MA (US); John G. Heston, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/819,684

(22) Filed: Nov. 21, 2017

(51) Int. Cl.
*H03M 1/06* (2006.01)
*H03M 3/00* (2006.01)

(52) U.S. Cl.
CPC ........... *H03M 3/328* (2013.01); *H03M 3/358* (2013.01); *H03M 3/42* (2013.01); *H03M 3/458* (2013.01)

(58) Field of Classification Search
CPC ........ H03M 3/328; H03M 3/358; H03M 3/42; H03M 3/458
USPC .................................................. 341/118–155
See application file for complete search history.

(56) References Cited

U.S. PATENT DOCUMENTS

| | | | |
|---|---|---|---|
| 4,034,367 A | 7/1977 | Sugiyama et al. | |
| 4,968,987 A * | 11/1990 | Naka .................... | H03M 3/328 341/143 |
| 5,073,777 A * | 12/1991 | Fukuhara ............. | H03M 3/326 341/131 |
| 5,148,163 A | 9/1992 | Frindle | |
| 5,627,535 A * | 5/1997 | Ichimura ............... | H04S 1/007 341/131 |
| 5,963,157 A | 10/1999 | Smith | |
| 6,091,398 A * | 7/2000 | Shigeta ................ | G09G 3/2022 345/204 |
| 6,738,002 B2 * | 5/2004 | Ercan ..................... | H03M 3/33 341/131 |
| 8,223,050 B2 * | 7/2012 | Matsumoto ........... | H03M 3/332 341/131 |
| 8,519,878 B2 * | 8/2013 | Jensen ................... | H03M 3/396 341/120 |
| 9,503,120 B1 * | 11/2016 | Tan ........................ | H03M 3/30 |
| 9,608,655 B1 * | 3/2017 | Li .......................... | H03M 1/069 |

OTHER PUBLICATIONS

Wannamaker, "The Theory of Dithered Quantization," A thesis presented to the University of Waterloo in fulfillment of the thesis requirement for the degree of Doctor of Philosophy in Applied Mathematics, Waterloo, Ontario, Canada, 2003.

Plisch, "Maximizing SFDR Performance in the GSPS ADC: Spur Sources and Methods of Mitigation," Application Report, SLAA617, Texas Instruments, Dec. 2013.

(Continued)

*Primary Examiner* — Lam T Mai
(74) *Attorney, Agent, or Firm* — Burns & Levinson, LLP; Joseph M. Maraia

(57) ABSTRACT

An analog-to-digital conversion system includes two quantizers having a least significant bit arranged in a parallel pair. An input circuit coupled to the quantizers provides an analog input signal to the quantizers. A dither generator coupled to the quantizers provides an analog differential dither signal for perturbing quantization of the analog input signal. A combiner coupled to the quantizers adds respective outputs of the quantizers to obtain a linearized digital representation of the analog input signal.

18 Claims, 4 Drawing Sheets

(56) References Cited

OTHER PUBLICATIONS

Melkonian, "AN-804 Improving A/D Converter Performance Using Dither," Literature Number: SNOA232, National Semiconductor Application Note 804, Texas Instruments, Feb. 1992.
"Dithering in Analog-to-digital Conversion," 0869-BDC-06/07, e2v semiconductors SAS, www.e2v.com, 2007.
Domanska, "A-D Conversion with Dither Signal-Possibilities and Limitations," Measurement Science Review, vol. 1, No. 1, Jan. 1, 2001, pp. 75-78, XP055564674.
Wagdy, "Effect of Various Dither Forms on Quantization Errors of Ideal A/D Converters," IEEE Transactions on Instrumentation and Measurement, vol. 38, No. 4, Aug. 1, 1989, pp. 850-855, XP055564681.
Invitation to Pay Additional Fees from related PCT Application No. PCT/US2018/061904 mailed Mar. 14, 2019.

\* cited by examiner

ANALOG TO DIGITAL CONVERSION USING DIFFERENTIAL DITHER

TECHNICAL FIELD

The present disclosure relates generally to the analog-to-digital conversion, and more specifically, to linearization through dithering.

BACKGROUND

High performance analog-to-digital converters (ADCs) are now widely used in many applications, including RF receivers (e.g., radar) and electronic countermeasures, communication systems, test instrumentation and others, that handle large dynamic ranges of signal amplitudes of high data rate signals. Ideal ADCs have equally spaced levels of voltage references against which the input signal is compared. Ideal ADCs transfer energy from the frequencies of the input signal or signals to other frequencies as a result of the inherent non-linearity of their transfer function. The transferred energy is often referred to as spurs, as they show up as spikes in a spectrogram of the device output when the input is a tone. Most ADCs suffer additional non-linearities. One particular problem in such high performance ADCs is differential non-linearity (DNL) errors. DNL error is generally defined as the difference between an actual transfer function step width of an ADC and the ideal "stair case" where each quantization level is spaced by exactly 1 least significant bit (LSB). Errors are often due to mismatches in the resistance ladder providing threshold reference voltages and its comparator circuits. Spurs can cause a significant degradation for some systems, especially where a large signal is present and the system must reliably detect much smaller signals at the same time. The spurs or distortion can cause false or missed detections. The electronics industry is constantly striving to improve the spurious free dynamic range (SFDR) of ADCs. A receiver with excellent SFDR is able to detect small signals in the presence of much larger ones. Non-linearities, for example DNL errors, effectively decrease a receiver's SFDR rating.

A well-known technique called dithering is often required to maximize SFDR. Dithering is the process of adding an uncorrelated signal, such as pseudo random noise (PRN) or broadband noise, to a desired analog signal prior to the analog input gate of the ADC. A common approach to creating dither is to use a noise or thermal diode whose output is summed with the wanted signal prior to digitization. Although the injected dither does not eliminate the errors, it whitens the resulting errors, spreading the spurs across a wideband of frequencies with much less power at any frequency. Without dither an input signal is repeatedly quantized at a particular portion of the dynamic range with some given DNL errors of the ADC, thereby repetitively providing the same error. The repetition forces the spurious signals to be at a set of frequencies and amplitudes for a given input. Adding dither to the input results in the combined signal being converted at different points in the dynamic range, across a wider set of reference voltages interacting with different ones as the dither varies, even when the wanted inputs signal has a constant waveform. Adding dither improves the resolution and linearity of the conversion by effectively smoothing the quantization errors of the ADC's transfer function. However, while spurs are reduced, a commensurate increase in the noise floor occurs as adding the dither is equivalent to adding noise to the wanted signal. Many conventional systems simply accept degradation of the noise floor to improve SFDR or sub-optimize SFDR to avoid the additional noise.

FIG. 1A illustrates a prior art embodiment of a SFDR maximization, wherein a digital PRN generator 10 generates a random digital signal that is converted to an analog dither signal by a high dynamic range digital-to-analog converter (DAC) 12 coupled to a summer 14, which adds the analog dither signal to an analog input signal before the dithered analog signal is digitized by an ADC 16. The "known" random digital signal is subtracted from the converter response at a digital subtractor 18. This is a more expensive process for dither creation than a simple diode and will not be 100% random.

FIG. 1B shows another common technique for spur reduction, wherein a wideband non-correlated signal is generated using a thermal noise source 20. The signal from the thermal noise source 20 then passes through a low pass filter 22, which either attenuates or passes the signal based on its frequency. The signal is then added to the analog input signal within a summer 14. Depending upon on how much noise must be injected, signal-to-noise ratio (SNR) of an ADC 16 may be unduly sacrificed.

SUMMARY

There is a need therefore for a system of linearization using low cost dither sources which reduces the size and number of spurs without raising the noise floor.

In at least one aspect, the subject technology relates to an analog to digital conversion system having a first quantizer and a second quantizer arranged in a parallel pair. The quantizers have a least significant bit (LSB) size. An input circuit is coupled to the quantizers and operational to provide an analog input signal to the quantizers. A dither generator is coupled to the quantizers and operational to provide an analog differential dither signal for perturbing quantization of the analog input signal. A combiner is coupled to the quantizers and operational to add respective outputs of the quantizers to obtain a linearized digital representation of the analog input signal.

In at least some embodiments, a voltage source is coupled to the second quantizer and operational to provide a voltage to the second quantizer. The voltage can have a DC offset of ½ LSB relative to the voltage reference of the first quantizer. In at least some embodiments the dither generator is coupled to the first quantizer to provide the analog differential dither signal at a positive voltage reference terminal of the first quantizer and the dither generator is coupled to the second quantizer to provide the analog differential dither signal at a negative voltage reference terminal of the second quantizer. The analog differential dither signal perturbs the analog input signal by an equal and opposite amount within each quantizer. The analog differential dither signal can be a uniform noise.

In at least some embodiments a comparator is coupled to the input circuit and the combiner to measure a significant bit of the analog input signal and extend the range of the quantizers. The comparator can be set at a most significant bit (MSB) or an LSB. In some embodiments, the analog differential dither signal can be passed through a voltage inverter and summed with the analog input signal to generate a sum, the sum then being provided to the second quantizer at a positive voltage reference terminal of the second quantizer. The analog differential signal is subtracted from the analog input signal to generate a difference, the difference being provided to a positive voltage reference terminal of the second quantizer.

In one aspect, the subject technology relates to a method of analog-to-digital conversion. The method includes configuring an input circuit to receive an analog input signal. The input circuit is coupled to a first quantizer and a second quantizer, the quantizers being arranged in parallel and having a least significant bit (LSB) size. A dither generator and a combiner are coupled to the quantizers. The analog input signal is transmitted to the quantizers. The dither generator is operated to provide an analog differential dither signal to the quantizers for perturbing quantization of the analog input signal. The combiner is operated to add respective outputs of the quantizers to obtain a linearized digital representation of the analog input signal.

In some embodiments, the analog input signal and the digital differential digital signal are first summed before being provided to the first quantizer via a positive voltage reference terminal of the first quantizer. In some embodiments, the differential dither signal is subtracted from the analog input signal to get a difference before providing the difference to the second quantizer via a positive voltage reference terminal of the second quantizer. The analog differential dither signal can also provided to the second quantizer at a negative voltage reference terminal of the second quantizer. In some embodiments a DC offset voltage is provided to the second quantizer. The DC offset voltage can one half of the LSB.

BRIEF DESCRIPTION OF THE FIGURES

The subject technology is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

The details described and illustrated herein are by way of example and for purposes of illustrative description of the exemplary embodiments only and are presented in the case of providing what is believed to be the most useful and readily understood description of the principles and conceptual aspects of the disclosure. In this regard, no attempt is made to show structural details of the subject matter in more detail than is necessary for the fundamental understanding of the disclosure, the description taken with the drawings making apparent to those skilled in that how the several forms of the present disclosure may be embodied in practice with additional components or steps and/or without all of the components or steps that are described. Further, like reference numbers and designations in the various drawings indicate like elements.

Figure 1:
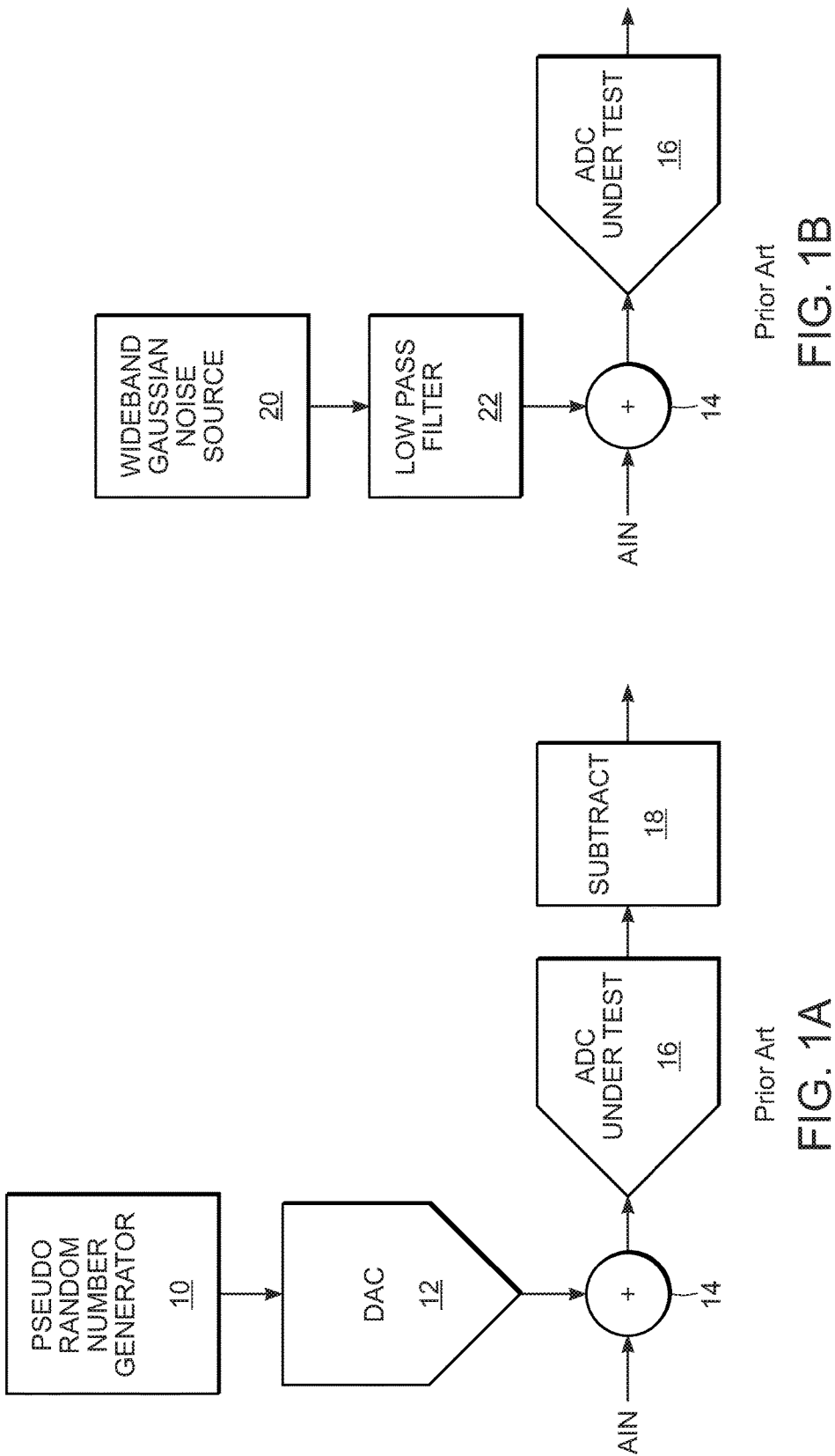
FIGS. 1A and 1B are schematic circuit diagrams of example prior art embodiments of dithered analog to digital conversion systems.
Figure 2:
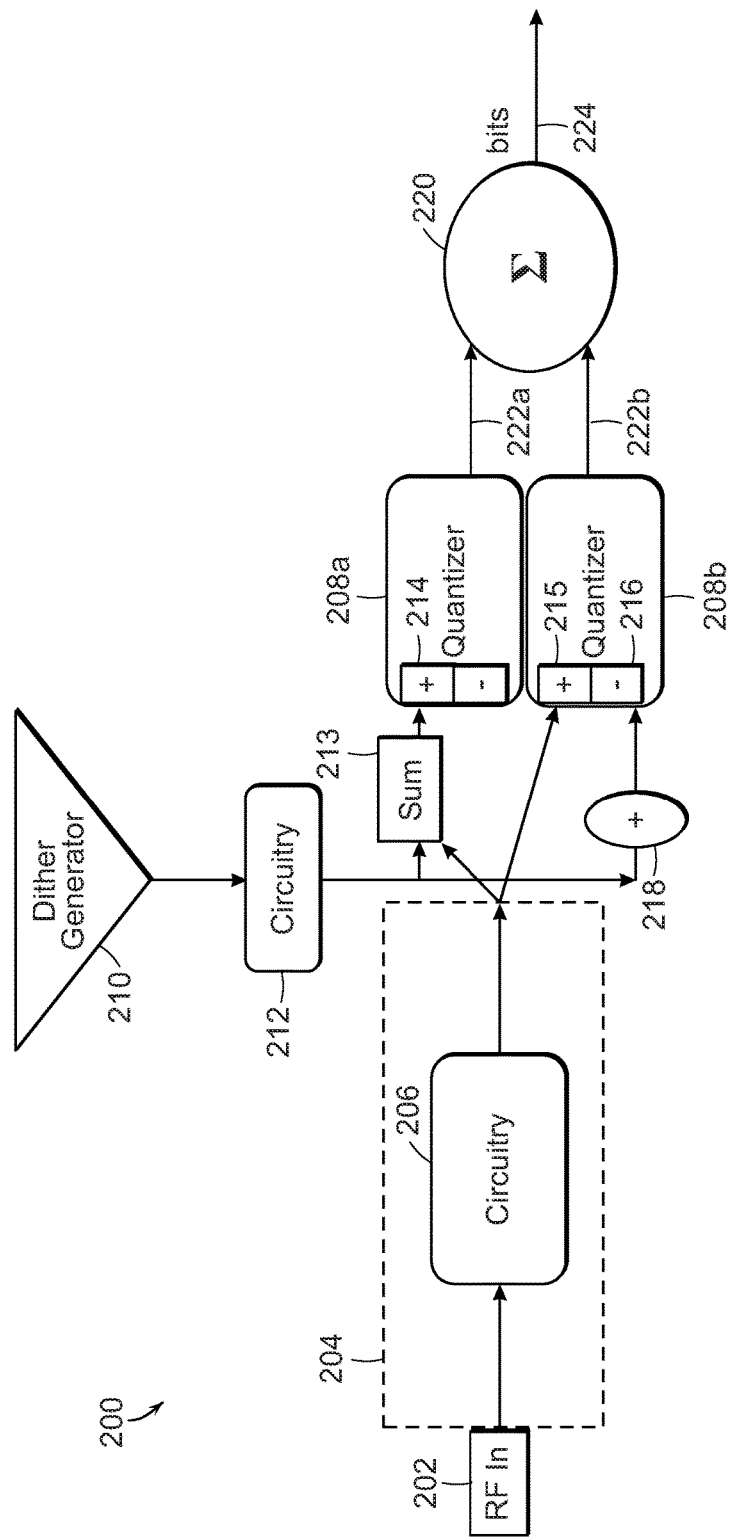
FIG. 2 is a block circuit diagram of an exemplary analog to digital conversion system in accordance with subject technology.

Referring now to FIG. 2, a block diagram of an analog to digital conversion system 200 using differential dither in accordance with the subject technology is shown. System 200 adds a dither signal to an analog signal being digitized in order to linearize (i.e., reduce the size and number of spurs of) the quantization in a manner that removes noise from the final digitized output more effectively than other known dither systems. This implementation is less costly to achieve randomness and decorrelation with other dither sources than conventional dithered quantization. For example, an analog dither source, such as a thermal diode or noise diode, can be used with the system 200 to reduce cost. The addition of dither to the intended signal prior to digitization, in essence, spreads the effect of the signal's interaction with the quantization measurement system, reducing the measurement system's imperfections.

Still referring to FIG. 2, the system 200 receives an analog input signal from an outside source 202 along an input circuit 204. The analog input signal can come from any analog signal source, such as an antenna receiving an RF signal. The input circuit 204 includes optional front end circuitry 206 which can include any necessary components for processing the analog input signal as are typically used in the art. For example, the front end circuitry 204 can include an amplifier circuit, a frequency conversion circuit having a local oscillator, an adder circuit, a gain control circuit, or the like. The system 200 also includes a first quantizer 208a and a second quantizer 208b (generally 208) which form a parallel pair, each quantizer 208 having a shared least significant bit (LSB) size. The analog input signal is passed from the input circuit 204 into the quantizers 208 for conversion from analog to digital (i.e. digitization). Each of the quantizers 208 are N–1 bit analog-to-digital converters which ultimately combine to a single N-bit analog to digital converter ("N" being used herein as a variable representing a numerical value), as discussed further herein.

A dither generator 210 creates an analog noise signal which serves as an analog differential dither signal within the system 200. In one embodiment, the dither generator 210 generates a random, non-deterministic, analog noise signal such as through use of a low-cost thermal noise diode (e.g. for analog Gaussian dither). The quantum mechanical nature of electron-hole pairing process within such devices produces a truly random noise signal with very high bandwidth. In another embodiment, the dither generator 210 comprises a uniform analog noise generator to create the analog noise signal. The analog noise signal is preferably uncorrelated in time, uncorrelated with the desired analog input signal, and has "white noise" properties. The probability distribution of amplitudes should be as close to either Gaussian or uniform as practical. The level of the analog noise signal should be commensurate with the level of nonlinearity expected from the quantizers 208. Since the noise power levels created by some dither generators may be quite small, optional processing circuitry 212 can be coupled to the dither generator 210. The processing circuitry 212 can include circuitry to control the gain of the analog noise signal, low cost operational amplifiers, or the like, as needed.

The dither generator 210 is coupled to the quantizers 208 and the analog noise signal is applied to the first and second quantizers 208 as an analog differential dither signal for perturbing the quantization of the analog input signal to remove periodicity of quantization error and improve the dynamic range of the quantizers 208. The dither signal is "differential" because complimentary signals of opposite power are applied to each quantizer 208. For example, the dither generator 210 might send a signal having a power X to the quantizers 208. An analog differential dither signal of +X would then be provided to the first quantizer 208a while an analog differential dither signal of −X would be applied to the second quantizer 208b. This can be accomplished in several ways. In one embodiment, this is done by summing the analog differential dither signal with the input signals in summer 213 and providing or transmitting the sum to a positive voltage reference terminal 214 of the first quantizer 208a. In this embodiment, the input signal alone is then provided to the positive reference terminal 215 of the second quantizer 208b and the dither signal is provided to a negative voltage reference terminal 216 of the second quantizer 208b (the dither generator 210 being coupled to the respective reference terminals 214, 216), where the quantizer 208b provides a digital representation of the difference of the signals at its respective inputs 215, 216. In the embodiment shown, the second quantizer 208b is also coupled to an optional voltage source 218 which provides a DC offset to the negative voltage reference terminal 216 of the second quantizer 208b. In some cases, the offset can be dependent on the LSB of the quantizers 208. To that end, the voltage source 218 sometimes provides a ½ LSB offset between the first quantizer 208a and the second quantizer 208b.

Within each quantizer 208, the analog input signal is combined with the respective (i.e. positive or negative) analog differential dither signal. In other words, each quantizer 208 combines an opposite differential dither signal with the analog input signal, perturbing the analog input signal in equal and opposite amounts to form dithered analog signals. In the second quantizer 208b, the analog input signal and analog differential dither signal can also be combined with the optional offset voltage from the voltage source 218 (e.g. a ½ LSB offset voltage). The offset voltage can also be provided to the quantizer 208b as a sum with the input signal or as a sum with the voltage references of the quantizer 208b. In other embodiments, the dither signal can be passed through a voltage inverter and then summed with the input signal to generate a sum, the sum being provided to the positive terminal of the second quantizer 208b. Alternatively, the dither signal can be subtracted from the input analog signal to generate a difference, the difference then being provided to the positive terminal of a second quantizer. When N−1 bit quantizers are used to replace an N-bit quantizer, the quantization noise will be approximately the same as if an N-bit quantizer had been used.

The quantizers 208 include a plurality of comparators (not distinctly shown) arranged in a parallel configuration for comparing a corresponding plurality of threshold reference voltages against the dithered analog signal. Each comparator can be coupled to the input circuit 204 to receive the analog input signal, the dither generator 210 to receive the analog differential dither signal, and a combiner 220 at the comparator outputs. An N-bit quantizer will include $2^N-1$ comparators. Therefore a 3-bit quantizer has seven comparators. The quantizers 208 output digital equivalent signals 222a, 222b (generally 222) representative of the comparison of the dithered analog signals and the threshold reference voltages carried out by the comparators. The output digital equivalent signals 222 of each quantizer 208 are then added within the combiner 220 and unwanted noise (e.g. quantization noise and noise from the optional DC offset voltage) is removed to obtain a linearized digital representation of the analog input signal which is output as digital signal 224. Notably, since a differential dither was applied to each quantizer 208, the differential dither cancels out when the digital equivalent signals 222 are summed in the combiner 220 and no further steps need to be taken to adjust for the inclusion of the analog differential dither signals. This results in a digital signal 224 with a higher linearity than if a single quantizer were used and does not suffer from an increased noise floor as a result of dithering.

Figure 3:
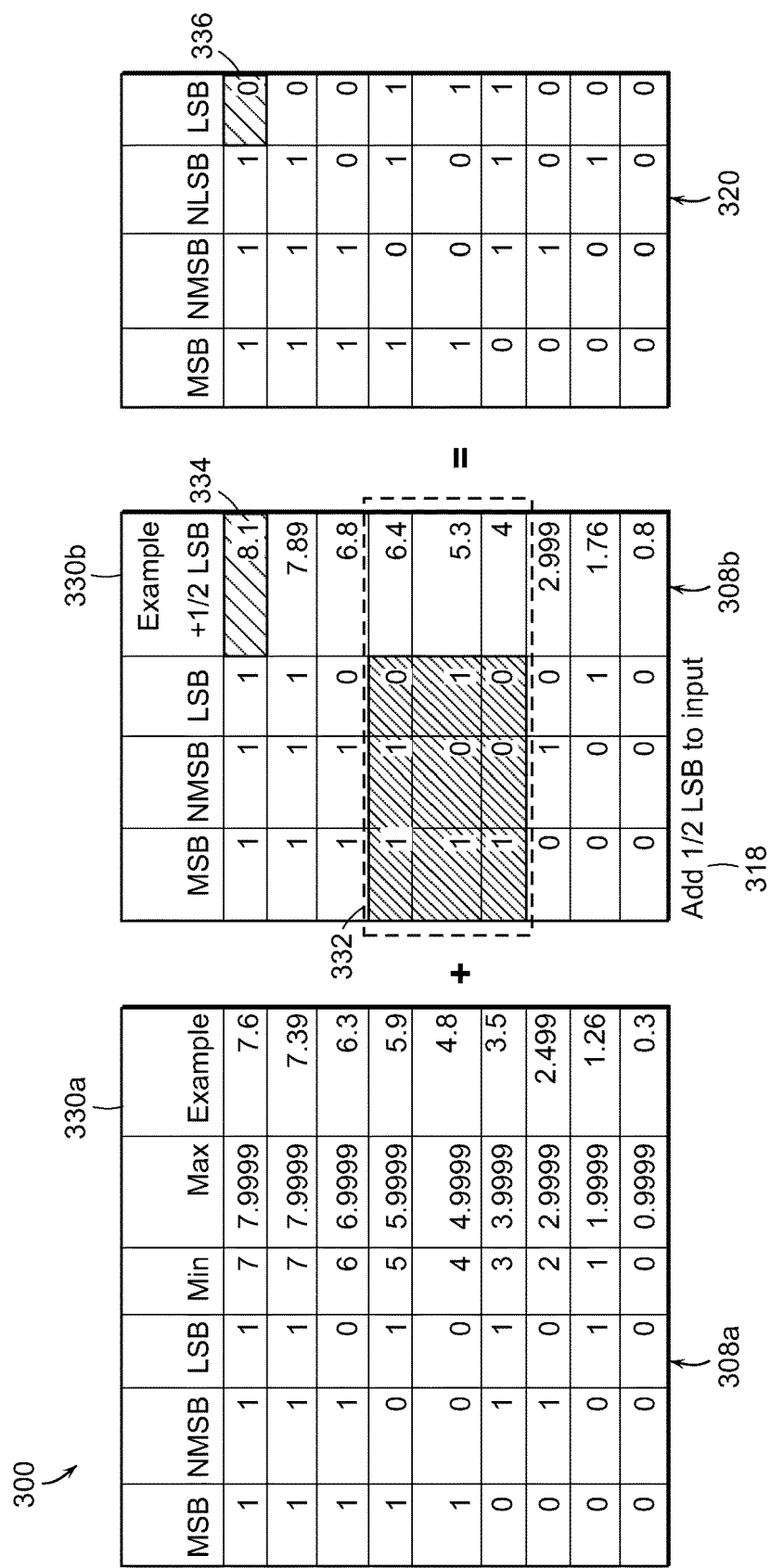
FIG. 3 shows exemplary tables depicting the calculations carried out within quantizers and a combiner in accordance with the subject technology.

Referring now to FIG. 3, exemplary tables are shown generally at 300 depicting a process of calculating and offsetting significant bits within two quantizers and then summing the significant bits. The underlying quantizers are 3-bit quantizers and can functional similarly to the quantizers 208 shown in FIG. 2. The first table 308a shows the incoming signal and significant bit calculations of a first quantizer 208a. The "Example" column 330a represents samples of the analog input signal provided to the first quantizer 208a. Since the first quantizer 208a is 3-bit, the samples of the analog input signal are digitized within the first quantizer 208a by generating most significant bit (MSB), next most significant bit (NMSB), and LSB values of either "0" or "1" for each sample. The digitization within the second quantizer 208b is shown in the second table 308b. The second quantizer 208b functions similar to the first quantizer 208a, except a ½ LSB offset 318 is added to the sample as shown in column 330b. Each quantizer 208 rounds down to the next whole number of the sample value. Therefore in the rows highlighted by box 332, the offset 318 bumps the sample value within the second quantizer 208b above the next highest whole number, increasing the calculated significant bit value shown within the second table 308b as compared to the first table 308a. Further, in the top row of the second table 308b, the offset 318 has pushed the sample value above 8, which is above the range of the 3-bit quantizer, as can be seen in block 334. Therefore another comparator would need to be provided to gain full dynamic range for the 3 bit quantizers (e.g. as seen in FIG. 4).

Still referring to FIG. 3, after the analog input signals are digitized within each quantizer 208, they are then sent to a combiner to be summed (e.g. the combiner 220 of FIG. 2). The combination of the significant bit calculations of the quantizers 208 shown in tables 308a, 308b is shown in summing table 320. The data shown in table 320 can then be relied upon to obtain a linearized digital representation of the analog input signal. It is notable that since the sample 332 was outside the range of the second quantizer 208b, the resulting error in significant bits was carried over in the summing table 320 and can be seen in the final block 336 of the first row of the summing table 320.

Figure 4:
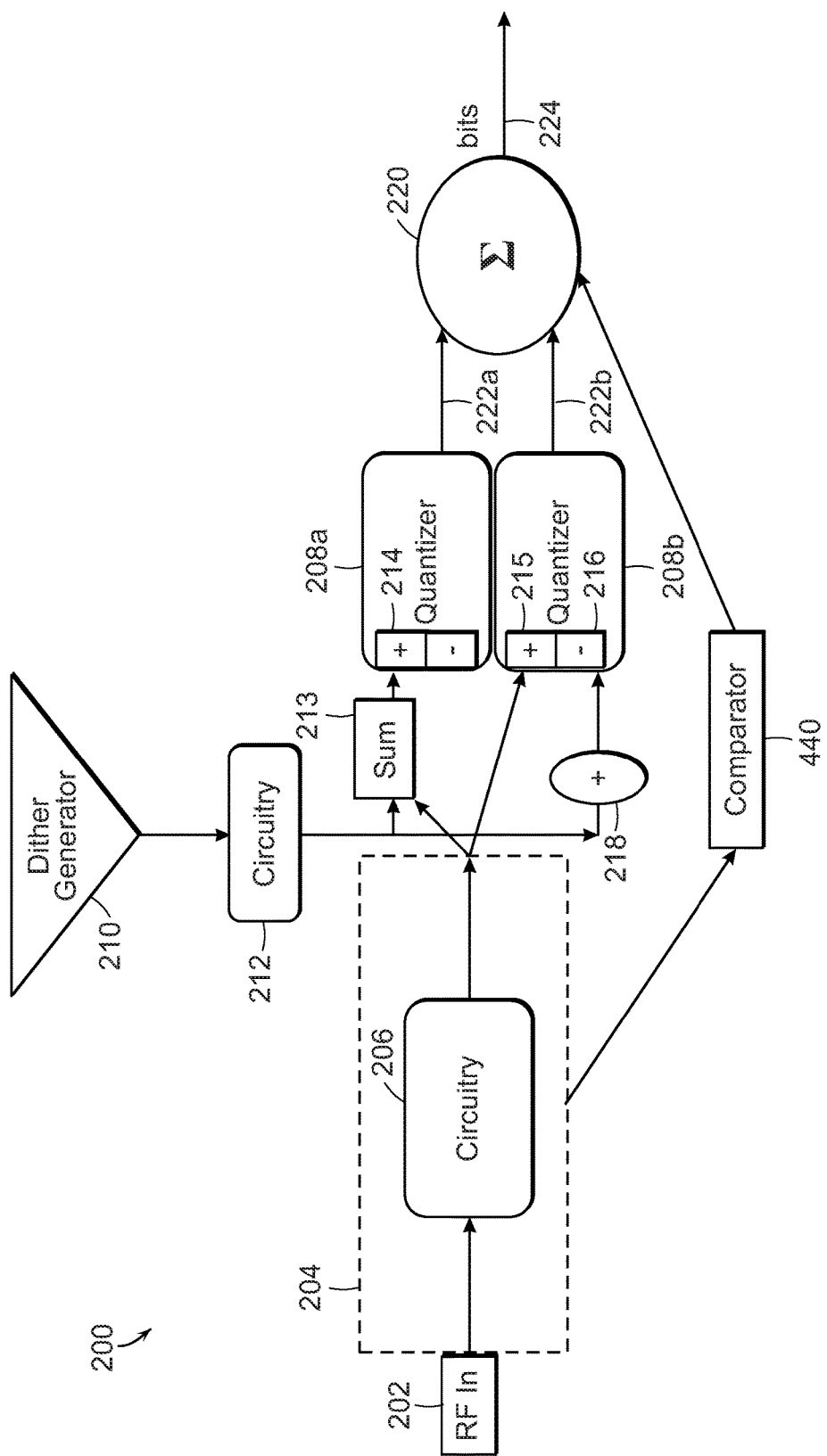
FIG. 4 is a block circuit diagram of an exemplary analog to digital conversion system in accordance with subject technology.

Referring now to FIG. 4 a block diagram of an analog to digital conversion system 200 using differential dither in accordance with the subject technology is shown generally at 400. The system 400 is similar to the system 200 of FIG. 2, except that a separate comparator 440 is included. As noted above, the two quantizers 208 are typically N−1 bit quantizers meant to replace a single N-bit quantizer. An N-bit quantizer has $2^N-1$ comparators, so a 4-bit quantizer would have fifteen comparators. Two N−1 bit quantizers replacing a single N-bit quantizer would therefore have one less total comparator (e.g. fourteen comparators). Therefore to gain full dynamic range of an N-bit quantizer, an additional comparator 440 is included. The comparator 440 can be set at an MSB or an LSB of the quantizers 208 and can be calibrated to account for samples outside the range of the quantizers 208 (e.g. sample 332 of FIG. 3). While two 3-bit quantizers 208 are given as an example, two N−1 bit quantizers replacing a single N-bit quantizer will always have one less comparator, so including an additional comparator 440 is beneficial when two quantizers of any number of bits are used to replace a single quantizer.

Various embodiments of the above-described systems and methods may be implemented in digital electronic circuitry, in computer hardware, firmware, and/or software. The implementation can be as a computer program product (i.e., a computer program tangibly embodied in an information carrier). The implementation can, for example, be in a machine-readable storage device and/or in a propagated signal, for execution by, or to control the operation of, data processing apparatus. The implementation can, for example, be a programmable processor, a computer, and/or multiple computers. Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer can be operatively coupled to receive data from and/or transfer data to one or more mass storage devices for storing data, e.g., magnetic, magneto-optical disks, or optical disks.

A computer program can be written in any form of programming language, including compiled and/or interpreted languages, and the computer program can be deployed in any form, including as a stand-alone program or as a subroutine, element, and/or other unit suitable for use in a computing environment. A computer program can be deployed to be executed on one computer or on multiple computers at one site.

The circuitry can, for example, be a FPGA (field programmable gate array) and/or an ASIC (application-specific integrated circuit). Modules, subroutines, and software agents can refer to portions of the computer program, the processor, the special circuitry, software, and/or hardware, e.g., a controller such as a microcontroller, which implements that functionality.

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements (e.g., electronics, circuitry, and the like) shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed. It is noted that the foregoing examples have been provided merely for the purpose of explanation and are in no way to be construed as limiting of the present disclosure.

What is claimed is:

1. An analog-to-digital conversion system, comprising:
    a first quantizer and a second quantizer arranged in a parallel pair, the quantizers having a least significant bit (LSB) size;
    an input circuit coupled to the quantizers and operational to provide an analog input signal to the quantizers;
    a dither generator coupled to the quantizers and operational to provide an analog differential dither signal for perturbing quantization of the analog input signal; and
    a combiner coupled to the quantizers and operational to add respective outputs of the quantizers to obtain a linearized digital representation of the analog input signal.

2. The system of claim 1 further comprising a voltage source coupled to the second quantizer and operational to provide a DC offset voltage to the second quantizer.

3. The system of claim 2 wherein the DC offset voltage is a DC offset voltage of one half the LSB.

4. The system of claim 1 wherein:
    the dither generator is summed with the analog input signal and transmitted to a positive voltage reference terminal of the first quantizer; and
    the dither generator is coupled to the second quantizer to provide the analog differential dither signal at a negative voltage reference terminal of the second quantizer.

5. The system of claim 1, wherein the analog differential dither signal perturbs the analog input signal by an equal and opposite amount within each quantizer.

6. The system of claim 1, wherein the analog differential dither signal comprises uniform noise.

7. The system of claim 1, wherein each quantizer comprises a 3-bit analog-to-digital converter.

8. The system of claim 1, further comprising a comparator coupled to the input circuit and the combiner to measure a significant bit of the analog input signal and extend the range of the quantizers.

9. The system of claim 8, wherein the comparator is set at a most significant bit (MSB).

10. The system of claim 8, wherein the comparator is set at a least significant bit (LSB).

11. The system of claim 1, wherein the analog differential dither signal is passed through a voltage inverter and summed with the analog input signal to generate a sum, the sum being provided to the second quantizer at a positive voltage reference terminal of the second quantizer.

12. The system of claim 1, wherein the analog differential signal is subtracted from the analog input signal to generate a difference, the difference being provided to a positive voltage reference terminal of the second quantizer.

13. A method of analog-to-digital conversion comprising:
    configuring an input circuit to receive an analog input signal;
    coupling the input circuit to a first quantizer and a second quantizer, the quantizers being arranged in parallel and having a least significant bit (LSB) size;
    coupling a dither generator and a combiner to the quantizers;
    transmitting the analog input signal to the quantizers;
    operating the dither generator to provide an analog differential dither signal to the quantizers for perturbing quantization of the analog input signal; and
    operating the combiner to add respective outputs of the quantizers to obtain a linearized digital representation of the analog input signal.

14. The method of claim 13 wherein, the analog input signal and the analog differential dither signal are first summed before being provided to the first quantizer via a positive voltage reference terminal of the first quantizer.

15. The method of claim 13 further comprising subtracting the analog differential dither signal from the analog input signal to get a difference before providing the difference to the second quantizer via a positive voltage reference terminal of the second quantizer.

16. The method of claim 13 wherein, the analog differential dither signal is provided to the second quantizer at a negative voltage reference terminal of the second quantizer.

17. The method of claim 13 further comprising providing a DC offset voltage to the second quantizer.

18. The method of claim 17 wherein the DC offset voltage is one half of the LSB.

* * * * *